United States Patent
Heyfitch et al.

(10) Patent No.: US 11,127,643 B1
(45) Date of Patent: Sep. 21, 2021

(54) TEST STRUCTURES FOR VALIDATING PACKAGE FABRICATION PROCESS

(71) Applicant: Xilinx, Inc., San Jose, CA (US)

(72) Inventors: Vadim Heyfitch, Los Gatos, CA (US); Jaspreet Singh Gandhi, San Jose, CA (US)

(73) Assignee: XILINX, INC., San Jose, CA (US)

( * ) Notice: Subject to any disclaimer, the term of this patent is extended or adjusted under 35 U.S.C. 154(b) by 21 days.

(21) Appl. No.: 16/588,253

(22) Filed: Sep. 30, 2019

(51) Int. Cl.
*H01L 21/66* (2006.01)
*H01L 23/498* (2006.01)
*H01L 23/00* (2006.01)

(52) U.S. Cl.
CPC ........ *H01L 22/32* (2013.01); *H01L 23/49816* (2013.01); *H01L 24/16* (2013.01); *H01L 2224/16225* (2013.01)

(58) Field of Classification Search
CPC ... H01L 22/32; H01L 23/49816; H01L 24/16; H01L 2224/16225
See application file for complete search history.

(56) References Cited

U.S. PATENT DOCUMENTS

| | | | | |
|---|---|---|---|---|
| 6,026,221 A | * | 2/2000 | Ellison | H01L 23/5382 174/261 |
| 2011/0316572 A1 | * | 12/2011 | Rahman | G01R 31/2853 324/754.03 |
| 2012/0092033 A1 | * | 4/2012 | Shao | H01L 22/34 324/750.01 |
| 2013/0147505 A1 | * | 6/2013 | Wang | G01R 1/07342 324/755.01 |
| 2017/0178982 A1 | * | 6/2017 | Iruvanti | H01L 23/49866 |
| 2019/0287868 A1 | * | 9/2019 | Zelikson | H01L 24/17 |

* cited by examiner

*Primary Examiner* — Fernando L Toledo
*Assistant Examiner* — Neil R Prasad
(74) *Attorney, Agent, or Firm* — Patterson + Sheridan, LLP (57) ABSTRACT

A device includes a die with perimeters associated therewith, a substrate, and a test channel. The die is coupled to the substrate via a plurality of C4 bumps on a first side of the substrate. The substrate has connections on a second side of the substrate, opposite to the first side. A first connection connects a C4 bump on the first side of the substrate to a connection on the second side using a metal layer. The test channel is positioned within the substrate and further positioned outside of the perimeter of the die coupled to the substrate. The test channel is positioned at substantially a same depth as the metal layer of the first connection. A probe connecting to the test channel via pads positioned on a same side of the substrate that provides electrical characteristics that is substantially the same as electrical characteristics of the first connection.

20 Claims, 6 Drawing Sheets

TEST STRUCTURES FOR VALIDATING PACKAGE FABRICATION PROCESS

TECHNICAL FIELD

The disclosure generally relates to test structures and more particularly test structures that enable continuous testing of package fabrication process throughout the product life cycle.

BACKGROUND

Signal integrity and power integrity of electronic devices have become more stringent as dimensions of the package substrate shrink. In general, electrical metrics such as impedance are verified through measurements only once after the initial stage of fine-tuning of the fabrication process. The results are reported to a fabless semiconductor company by its substrate vendor by way of FAI, First Article Inspection. Unfortunately, there is no accurate mechanism to detect fabrication process drift over time, which causes performance degradation over time, especially in high speed signalling applications.

SUMMARY

Accordingly, a need has arisen to provide for test structures that can be used to detect the process drift over time, e.g., continuously post fabrication process stage. Furthermore, a need has arisen to not only detect drift over time but also to accurately measure electrical metrics in addition to impedance, e.g., dielectric constant, dielectric loss, surface roughness, roughness factor, loss per unit length, etc.

In some embodiments, the proposed device includes a die, a substrate, and a test channel. The die has a perimeter associated therewith. The die is coupled to the substrate via a plurality of C4 bumps on a first side of the substrate. The substrate has connections on a second side of the substrate that is opposite to the first side. Moreover, the substrate comprises a first connection connecting a C4 bump of the plurality of C4 bumps on the first side of the substrate to a connection on the second side. The test channel having a length, the length of the test channel is positioned between the first side and the second side of the substrate, and further positioned outside of the perimeter of the die coupled to the substrate. The length of the test channel is positioned at substantially a same depth the first connection. The test channel is configured for connecting to a probe via pads positioned on a same side of the substrate that provides electrical characteristics that is substantially the same as electrical characteristics of the first connection.

In some embodiments, the pads associated with the test channel are positioned on the first side of the substrate. It is appreciated that in other embodiments the pads associated with the test channel are positioned on the second side of the substrate. It is appreciated that in some embodiments, the electrical characteristics may be a dielectric constant of a material within the substrate, dielectric loss, surface roughness associated with metal of the first connection, roughness factor associated with the first connection, or loss per unit length associated with the first connection.

In some embodiments, the connection on the second side is BGA. According to some embodiments, the test channel and pads associated therewith are positioned to have a same pitch as the BGA connection.

It is appreciated that in some embodiments, a length of the test channel is substantially equal to a length associated with the first connection. According to one embodiment, the test channel connects unused input/output pins to substrate pads. In some embodiments, the test channel is a standalone stripline. The test channel may be a single-ended stripline or a differential stripline. According to some embodiments, the test channel and pads associated therewith are positioned to have a same pitch as the plurality of C4 bumps.

In some embodiments, a device includes a die, a substrate, and a plurality of test channels. The die has a perimeter associated therewith. The die is coupled to the substrate via a plurality of C4 bumps on a first side of the substrate. The substrate has connections on a second side of the substrate that is opposite to the first side. The substrate comprises a first connection connecting a C4 bump of the plurality of C4 bumps on the first side of the substrate to a connection on the second side. A plurality of test channels, each test channel having a length, the length of the test channel is positioned between the first side and the second side of the substrate, and further positioned outside of a perimeter of the die coupled to the substrate. Each test channel of the plurality of test channels has a plurality of different lengths, and each test channel is positioned at a different depth between the first side and the second side of the substrate. The length of a selected test channel of the plurality of test channels has substantially a same length as the first connection and is substantially a same depth as a the first connection. The selected test channel exhibits similar electrical characteristics as the first connection. The selected test channel is configured for connecting to a probe via pads positioned on a same side of the substrate.

According to some embodiments, the pads associated with the selected test channel are positioned on the first side of the substrate. In some embodiments, the pads associated with the selected test channel are positioned on the second side of the substrate.

It is appreciated that probe connection to the selected test channel provides dielectric constant of a material within the substrate, dielectric loss, surface roughness associated with metal of the first connection, roughness factor associated with the first connection, and loss per unit length associated with the first connection.

According to some embodiments, the connection on the second side is BGA. The selected test channel and pads associated therewith are positioned to have a same pitch as the BGA connection, in some embodiments. The selected test channel may be a single-ended or a differential stripline.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Examples described herein relate to test structures that can be used to detect drift over time, e.g., continuously post fabrication process stage. The test structures enable the drift to be accurately measured by enabling electrical metrics measurement in addition to impedance, e.g., dielectric constant, dielectric loss, surface roughness, roughness factor, loss per unit length, loss per unit area, loss per watt, etc.

In some embodiments, the test structures are test channels within the package substrate. The substrate is coupled to the die and the test channels are positioned on the periphery of the substrate, e.g., outside of the perimeter and footprint of the die. The die may be connected to the substrate on one side using C4 bumps. The substrate may connect to other structures using BGA connections on another side of the substrate (i.e. opposite surface to the C4 bumps). The test channels may be positioned at different depths within the substrate and may have different lengths. The test structures also have pads to enable electrical connection to a probe. The pads are positioned on the surface of the substrate connecting to C4 bumps or they may be positioned on the surface of the substrate having the BGA connection. Accordingly, an appropriate test structure may be selected to exhibit similar electrical characteristics and metrics as a connection between a C4 bump through of the substrate and to a BGA connection. For example, a test channel at a certain depth within the substrate that is substantially at the same depth as the connection that connects a C4 bump to a BGA connection and exhibits similar electrical characteristics and metrics. Thus, the need to measure electrical characteristics and metrics by connecting the probe between the C4 bump and the BGA connection is eliminated. Rather, the electrical metrics can be measured by connecting the probe to the test structure. The reading from the probe can be used to measure electrical metrics such as dielectric constant, dielectric loss, surface roughness, roughness factor, loss per unit length, loss per unit area, loss per watt, etc. in addition to impedance.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. For example, various methods according to some examples can include more or fewer operations, and the sequence of operations in various methods according to examples may be different than described herein. In addition, an illustrated example need not have all the aspects or advantages shown. An aspect or an advantage described in conjunction with a particular example is not necessarily limited to that example and can be practiced in any other examples even if not so illustrated or if not so explicitly described.

Some general concepts will first be described to clarify terms and nomenclature used throughout this description.

Figure 1:
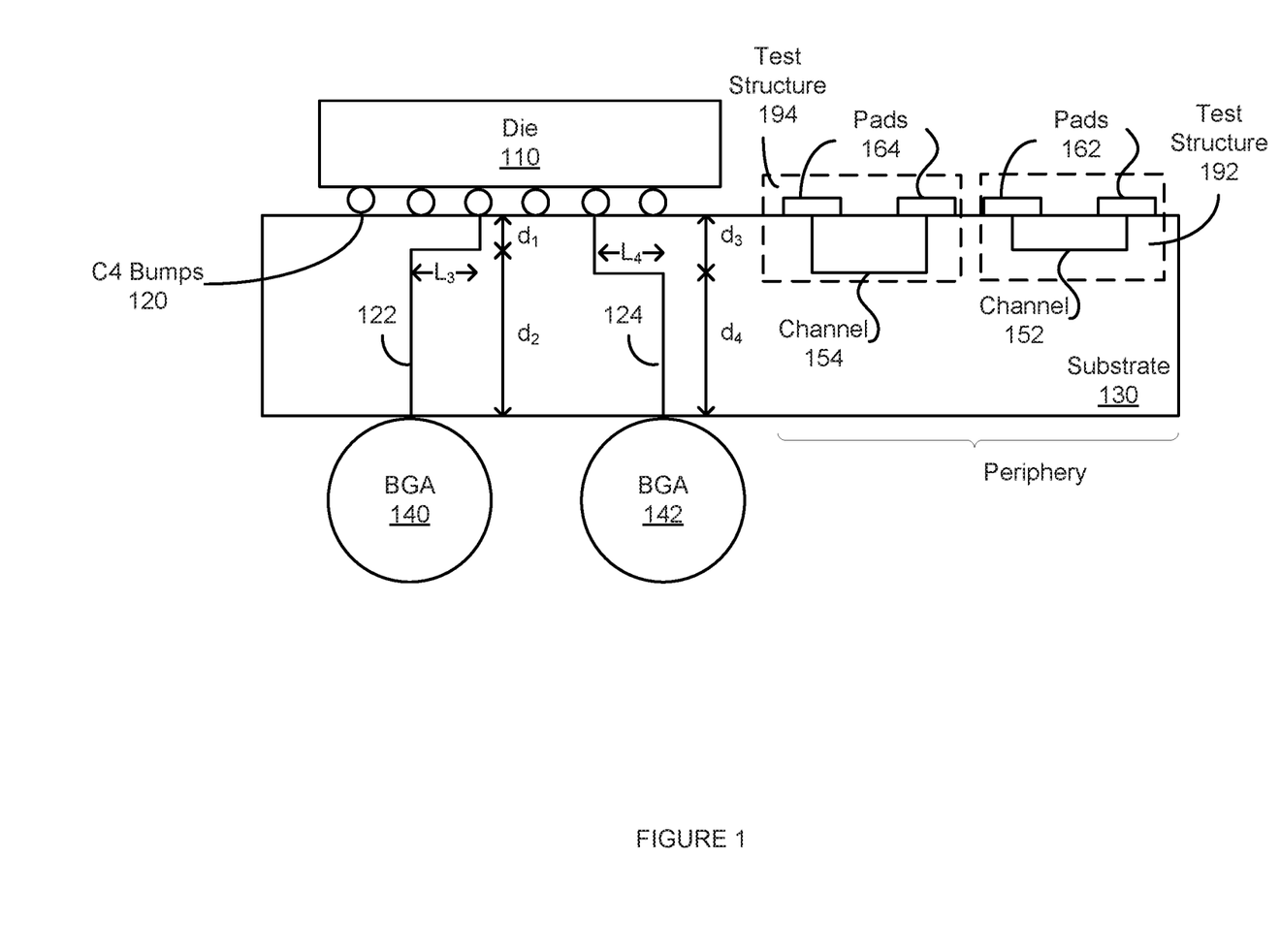
FIG. 1 shows a device with a test structure, according to some examples.

FIG. 1 shows a device with a test structure, according to some examples. The device according to some embodiments includes a die 110, e.g., a field programmable gate array (FPGA), an application specific integrated circuit (ASIC), etc., that is connected to a substrate 130 using C4 bumps 120. It is appreciated that the die 110 is connected to the substrate 130 using C4 bumps 120 for illustrative purposes only and should not be construed as limiting the scope of the embodiments. As such, other types of connection may be used. It is appreciated that the substrate 130 may have BGA connections 140 and 142 on a surface opposite to the surface with C4 bumps 120. The BGA connections 140 and 142 may establish electrical connection between the substrate 130 and other electronic devices or components. It is appreciated that a C4 bump may be electrically connected to a BGA connection through various metal layers within the substrate 130. In other words, the connection that electrically connects a C4 bump to a BGA connection may be connected using various metal layers. In this illustrative embodiment, a C4 bump is connected to a BGA connection, e.g., BGA connection 140, using electrical connection 122. Electrical connection 122 is positioned at a $d_1$ depth of the substrate 130 from the C4 bumps 120 surface of the substrate 130. In other words, the electrical connection 122 is at a $d_1$ depth from the C4 bump surface of the substrate 130 and it is at a $d_2$ depth from the BGA connection 140 of the substrate 130. The length of the electrical connection 122 is $d_1+d_2+L_3$. In contrast, another C4 bump is connected to a BGA connection, e.g., BGA connection 142, using electrical connection 124. Electrical connection 124 is positioned at a $d_3$ depth of the substrate 130 from the C4 bumps 120 surface of the substrate 130. In other words, the electrical connection 124 is at a $d_3$ depth from the C4 bump surface of the substrate 130 and it is at a $d_4$ depth from the BGA connection 142 of the substrate 130. The length of the electrical connection 124 is $d_3+d_4+L_4$.

It is appreciated that outside of the perimeter of the die 110 and its footprint, the test structures may be disposed. For example, the test structures may be disposed on the periphery of the substrate 130. In some embodiments, a first test structure 194 may include a test channel 154 and its corresponding pads 164, and a second test structure 192 may include a test channel 152 and its corresponding pads 162. It is appreciated that the pads of the test structure are disposed on one side of the substrate 130, e.g., on the same surface as the C4 bumps 120. It is appreciated that the test channels may be disposed at different depths of the substrate, as illustrated, and they may have different lengths. As such, the appropriate test structure may be selected.

It is appreciated that test structure 194 exhibits similar electrical characteristics and metrics as connection 124 because the test structure 194 has substantially similar geometrical attributes and positioning. For example, the test channel 154 is at depth $d_3$ which is substantially the same as the depth for connection 124. Moreover, the test channel 154 has a length that is substantially the same as the length of the connection 124. Accordingly, connecting a probe to the pads 164 of the test structure 194 provides various electrical metrics, e.g., dielectric constant, dielectric loss, surface roughness, roughness factor, loss per unit length, loss per unit area, loss per watt, etc. that is the same as that of connection 124.

It is appreciated that test structure 192 exhibits similar electrical characteristics and metrics as connection 122 because the test structure 192 has substantially similar geometrical attributes and positioning. For example, the test channel 152 is at depth $d_1$ which is substantially the same as the depth for connection 122. Moreover, the test channel 152 has a length that is substantially the same as the length of the connection 122. Accordingly, connecting a probe to the pads 162 of the test structure 192 provides various electrical metrics, e.g., dielectric constant, dielectric loss, surface roughness, roughness factor, loss per unit length, loss per unit area, loss per watt, etc. that is the same as that of connection 122.

Accordingly, appropriate test structures may be selected to connect the probe and make the necessary electrical metrics measurement that exhibits a similar electrical characteristics as the connection between a C4 bump to a BGA connection. It is appreciated that the test structures may be single ended or differential striplines. In some embodiments, the test structures may be unused and unconnected input/output pins of the substrate 130. In some embodiments, the test structures may be standalone striplines. It is appreciated that the test structures may be a combination of unused and unconnected input/output pins of the substrate 130 as well as standalone striplines. It is appreciated that unlike the conventional method where inaccurate measurement is made from the C4 bump to the BGA connection, the embodiments described herein are more accurate because the pads are on the periphery and are wrapped on the same surface of the substrate 130, e.g., pads on the C4 bump side, pads on the BGA connection surface side of the substrate 130, etc., to have the same pitch, thereby resulting in a more accurate measurement.

Figure 2:
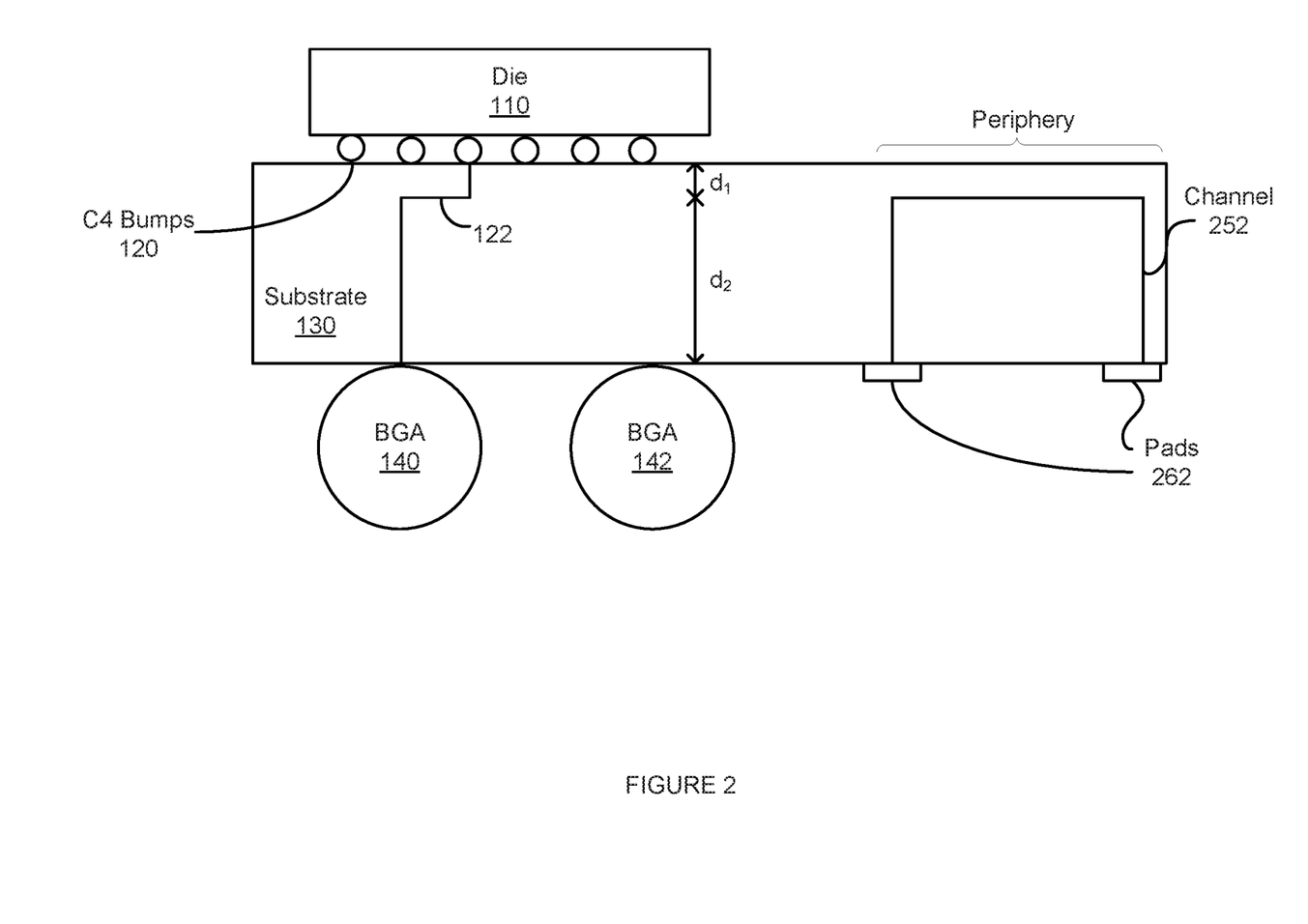
FIG. 2 shows an alternative device with a test structure, according to some examples.

FIG. 2 shows an alternative device with a test structure, according to some examples. FIG. 2 is substantially similar to that of FIG. 1 where the pads 262 of the test structure 192 are disposed on the BGA side of the substrate 130 and having a channel 252. In this embodiment, the test structure has the same pitch as the BGA connection, by having the pads 262 being disposed on the BGA side of the substrate 130 as opposed to the same pitch as the C4 bumps by having the pads 162 being disposed on the C4 bump side of the substrate 130 that was illustrated in FIG. 1.

It is appreciated that any number of test channels and test structures may be used and illustrating two test structures in FIG. 1 and one test structure in FIG. 2 is for illustrative purposes and should not be construed as limiting the scope of the embodiments.

Figure 3:
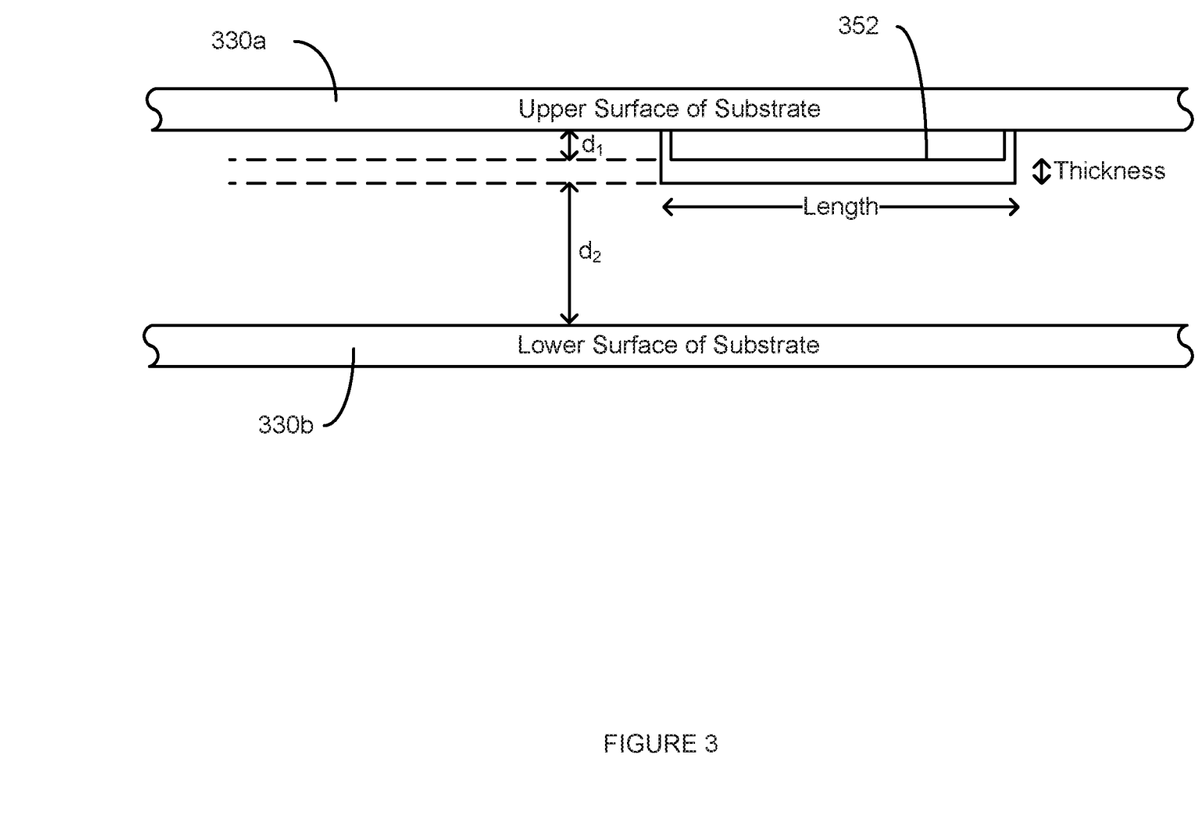
FIG. 3 shows a cross section of a test channel, according to some examples.

FIG. 3 shows a cross section of a test channel, according to some examples. Upper surface of substrate 330a may be the surface that is adjacent the C4 bumps 120 connecting to the die 110. The lower surface of substrate 330b may be the surface that is adjacent the BGA connection and is the surface opposite to the upper surface of the substrate 330a. The test channel 352 is disposed at a depth $d_1$ from the upper surface of the substrate 330a. As presented above, connection 122 was also at the same depth $d_1$. The test channel 352 has substantially the same length as the connection 122. As such, the dielectric constant, dielectric loss, surface roughness, roughness factor loss per unit length, loss per unit area, loss per watt, etc. as measured through the test structure is a true measurement of those electrical metrics of the connection 122.

Figure 4A:
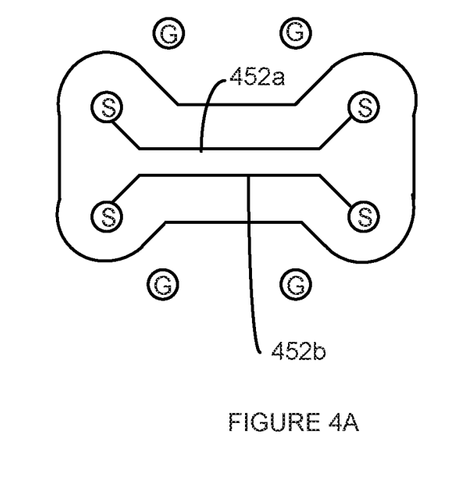
FIGS. 4A-4B show a top view of test structures, according to some examples.
Figure 4B:
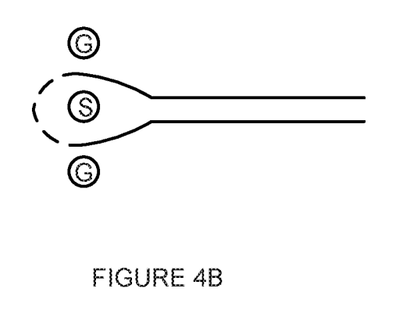

FIGS. 4A-4B show a top view of test structures, according to some examples. FIG. 4A shows a test structure with different striplines 452a and 452b where as FIG. 4B shows a test structure that is single ended stripline.

Figure 5:
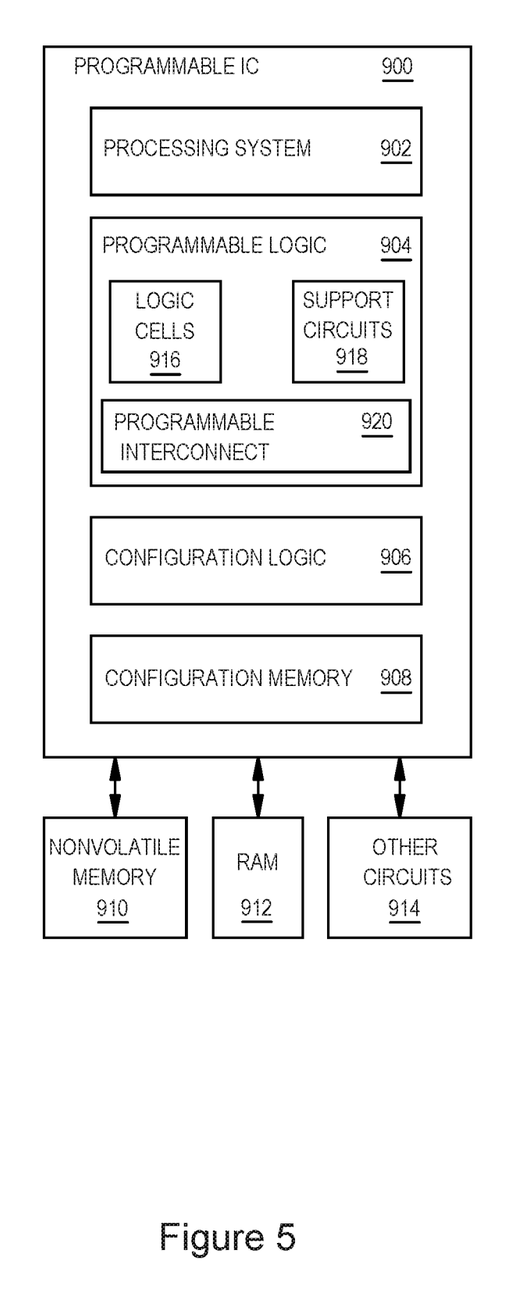
FIG. 5 is a block diagram depicting a programmable integrated circuit (IC), according to some examples.

FIG. 5 is a block diagram depicting a programmable integrated circuit (IC) 900 according to an example. The programmable IC 900 may be the integrated circuit (IC) chip of systems of FIGS. 1A-4B, in whole or in part. The programmable IC 900 includes a processing system 902, programmable logic 904, configuration logic 906, and configuration memory 908. The programmable IC 900 can be coupled to external circuits, such as nonvolatile memory 910, RAM 912, and other circuits 914.

In the example of FIG. 5, the processing system 902 can include microprocessor(s), memory, support circuits, IO circuits, and the like. The programmable logic 904 includes logic cells 916, support circuits 918, and programmable interconnect 920. The logic cells 916 include circuits that can be configured to implement general logic functions of a plurality of inputs. The support circuits 918 include dedicated circuits, such as transceivers, input/output blocks, digital signal processors, memories, and the like. The logic cells and the support circuits 918 can be interconnected using the programmable interconnect 920. Information for programming the logic cells 916, for setting parameters of the support circuits 918, and for programming the programmable interconnect 920 is stored in the configuration memory 908 by the configuration logic 906. The configuration logic 906 can obtain the configuration data from the nonvolatile memory 910 or any other source (e.g., the RAM 912 or from the other circuits 914).

Figure 6:
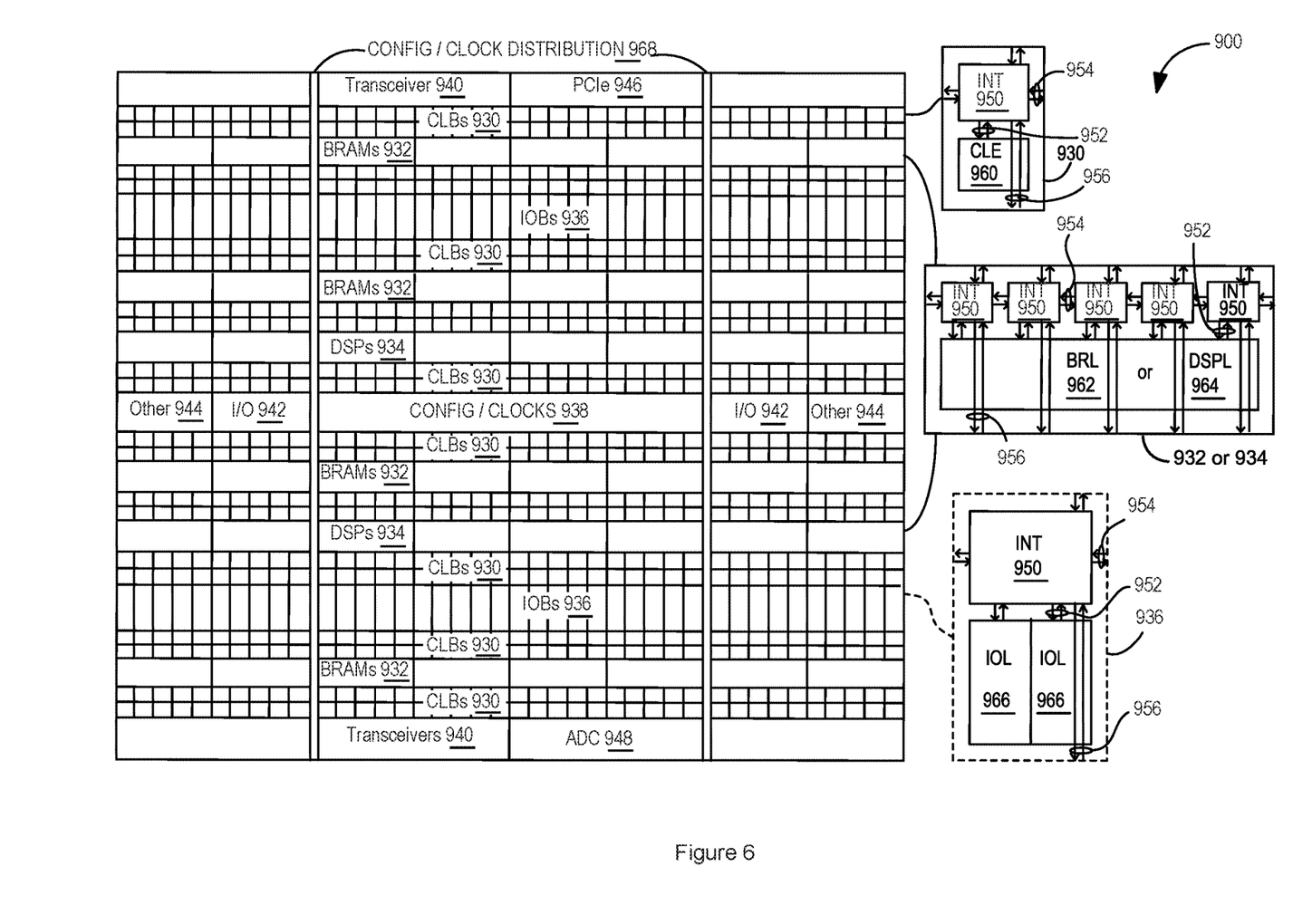
FIG. 6 is a field programmable gate array (FPGA) implementation of the programmable IC, according to some examples.

FIG. 6 illustrates an FPGA implementation of the programmable IC 900 that includes a large number of different programmable tiles including configurable logic blocks ("CLBs") 930, random access memory blocks ("BRAMs") 932, signal processing blocks ("DSPs") 934, input/output blocks ("IOBs") 936, configuration and clocking logic ("CONFIG/CLOCKS") 938, digital transceivers 940, specialized input/output blocks ("I/O") 942 (e.g., configuration ports and clock ports), and other programmable logic 944 such as digital clock managers, system monitoring logic, and so forth. The FPGA can also include PCIe interfaces 946, analog-to-digital converters (ADC) 948, and the like.

In some FPGAs, each programmable tile can include at least one programmable interconnect element ("INT") 950 having connections to input and output terminals 952 of a programmable logic element within the same tile, as shown by examples included in FIG. 6. Each programmable interconnect element 950 can also include connections to interconnect segments 954 of adjacent programmable interconnect element(s) in the same tile or other tile(s). Each programmable interconnect element 950 can also include connections to interconnect segments 956 of general routing resources between logic blocks (not shown). The general routing resources can include routing channels between logic blocks (not shown) comprising tracks of interconnect segments (e.g., interconnect segments 956) and switch blocks (not shown) for connecting interconnect segments. The interconnect segments of the general routing resources (e.g., interconnect segments 956) can span one or more logic blocks. The programmable interconnect elements 950 taken together with the general routing resources implement a programmable interconnect structure ("programmable interconnect") for the illustrated FPGA.

In an example implementation, a CLB 930 can include a configurable logic element ("CLE") 960 that can be programmed to implement user logic plus a single programmable interconnect element ("INT") 950. A BRAM 932 can include a BRAM logic element ("BRL") 962 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 934 can include a DSP logic element ("DSPL") 964 in addition to an appropriate number of programmable interconnect elements. An IOB 936 can include, for example, two instances of an input/output logic element ("IOL") 966 in addition to one instance of the programmable interconnect element 950. As will be clear to those of skill in the art, the actual I/O pads connected, for example, to the input/output logic element 966 typically are not confined to the area of the input/output logic element 966.

In the pictured example, a horizontal area near the center of the die is used for configuration, clock, and other control logic. Vertical columns 968 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A device comprising:
   a die having a perimeter associated therewith;
   a substrate, wherein the die is coupled to the substrate via a plurality of C4 bumps on a first side of the substrate, and wherein the substrate has connections on a second side of the substrate that is opposite to the first side, and wherein the substrate comprises a first connection connecting a C4 bump of the plurality of C4 bumps on the first side of the substrate to a connection on the second side; and
   a test channel having a length, the length of the test channel positioned between the first side and the second side of the substrate, and further positioned outside of the perimeter of the die coupled to the substrate, wherein a portion of the length of the test channel parallel to the first side is positioned at substantially a same depth as a portion of the first connection parallel to the first side, and wherein the test channel is configured for connecting to a probe via pads positioned on a same side of the substrate that provides electrical characteristics that are substantially the same as electrical characteristics of the first connection.

2. The device of claim 1, wherein the pads associated with the test channel are positioned on the first side of the substrate.

3. The device of claim 1, wherein the pads associated with the test channel are positioned on the second side of the substrate.

4. The device of claim 1, wherein the electrical characteristics are selected from a group consisting of dielectric constant of a material within the substrate, dielectric loss, surface roughness associated with metal of the first connection, roughness factor associated with the first connection, and loss per unit length associated with the first connection.

5. The device of claim 1, wherein the first connection on the second side is a BGA connection.

6. The device of claim 5, wherein the test channel and pads associated therewith are positioned to have a same pitch as the BGA connection.

7. The device of claim 1, wherein a length of the test channel is substantially equal to a length associated with the first connection.

8. The device of claim 1, wherein the test channel connects unused input/output pins to substrate pads.

9. The device of claim 1, wherein the test channel is a standalone stripline.

10. The device of claim 1, wherein the test channel is a single-ended stripline.

11. The device of claim 1, wherein the test channel is a differential stripline.

12. The device of claim 1, wherein the test channel and pads associated therewith are positioned to have a same pitch as the plurality of C4 bumps.

13. A device comprising:
    a die having a perimeter associated therewith;
    a substrate, wherein the die is coupled to the substrate via a plurality of C4 bumps on a first side of the substrate, and wherein the substrate has connections on a second side of the substrate that is opposite to the first side, and wherein the substrate comprises a first connection connecting a C4 bump of the plurality of C4 bumps on the first side of the substrate to a connection on the second side using a metal layer associated therewith; and
    a plurality of test channels, each test channel having a length, the length of the test channel positioned between the first side and the second side of the substrate, and further positioned outside of the perimeter of the die coupled to the substrate, wherein each test channel of the plurality of test channels has a plurality of different lengths, and each test channel is positioned at a different depth between the first side and the second side of the substrate, wherein the length of a selected test channel of the plurality of test channels has substantially a same length as the first connection and has a portion parallel to the first side that is positioned at substantially a same depth as a depth of a portion of the first connection that is parallel to the first side, wherein the selected test channel exhibits similar electrical characteristics as the first connection, and wherein the selected test channel is configured for connecting to a probe via pads positioned on a same side of the substrate.

14. The device of claim 13, wherein the pads associated with the selected test channel are positioned on the first side of the substrate.

15. The device of claim 13, wherein the pads associated with the selected test channel are positioned on the second side of the substrate.

16. The device of claim 13, wherein probe connection to the selected test channel provides dielectric constant of a material within the substrate, dielectric loss, surface roughness associated with metal of the first connection, roughness factor associated with the first connection, and loss per unit length associated with the first connection.

17. The device of claim 13, wherein the first connection on the second side is a BGA connection.

18. The device of claim 17, wherein the selected test channel and pads associated therewith are positioned to have a same pitch as the BGA connection.

19. The device of claim 13, wherein the selected test channel is a single-ended stripline.

20. The device of claim 13, wherein the selected test channel is a differential stripline.

\* \* \* \* \*